(12) United States Patent
Roath et al.

(10) Patent No.: US 10,212,864 B1
(45) Date of Patent: Feb. 19, 2019

(54) ELECTRICALLY-CONDUCTIVE GASKET

(71) Applicant: Ohio Associated Enterprises, LLC, Painesville, OH (US)

(72) Inventors: Alan L. Roath, Madison, OH (US); John T. Venaleck, Painesville, OH (US)

(73) Assignee: Ohio Associated Enterprises, LLC, Painesville, OH (US)

( * ) Notice: Subject to any disclaimer, the term of this patent is extended or adjusted under 35 U.S.C. 154(b) by 0 days.

(21) Appl. No.: 15/985,960

(22) Filed: May 22, 2018

(51) Int. Cl.
*H05K 9/00* (2006.01)
*H01R 13/6584* (2011.01)
*F16J 15/12* (2006.01)

(52) U.S. Cl.
CPC .......... *H05K 9/0015* (2013.01); *F16J 15/128* (2013.01); *H01R 13/6584* (2013.01)

(58) Field of Classification Search
CPC .......................... H05K 9/0015; H01R 13/6584
See application file for complete search history.

(56) References Cited

U.S. PATENT DOCUMENTS

| | | | | |
|---|---|---|---|---|
| 5,186,635 A | * | 2/1993 | Pechulis | H01R 13/6584 439/89 |
| 5,266,053 A | * | 11/1993 | Jamet | H01R 13/74 439/607.36 |
| 5,317,105 A | * | 5/1994 | Weber | H01R 13/6584 174/355 |
| 6,942,525 B2 | * | 9/2005 | Olson | H01R 13/422 439/660 |
| 7,727,018 B2 | | 6/2010 | Bright et al. | |
| 8,444,437 B2 | | 5/2013 | Szczesny et al. | |
| 8,597,047 B2 | * | 12/2013 | Soubh | H01R 13/6584 439/485 |
| 8,599,559 B1 | | 12/2013 | Morrison et al. | |
| 2004/0094904 A1 | * | 5/2004 | Grant | F16J 15/027 277/628 |
| 2005/0281514 A1 | * | 12/2005 | Oki | G02B 6/4201 385/92 |
| 2005/0282436 A1 | * | 12/2005 | Hanley | H01R 13/6584 439/607.19 |
| 2008/0038959 A1 | * | 2/2008 | Barringer | H01R 13/6584 439/607.3 |
| 2013/0072063 A1 | * | 3/2013 | Qiao | H01R 13/65802 439/607.01 |

* cited by examiner

*Primary Examiner* — Hung V Ngo
(74) *Attorney, Agent, or Firm* — Renner, Otto, Boisselle & Sklar, LLP

(57) ABSTRACT

A gasket made of an electrically-conductive elastomer is revealed that functions as both a water-tight seal and an electromagnetic interference (EMI) seal when mounting an electrical connector receptacle to an electrical panel or electrical box. This gasket is produced in a manner both unique and functional.

13 Claims, 8 Drawing Sheets

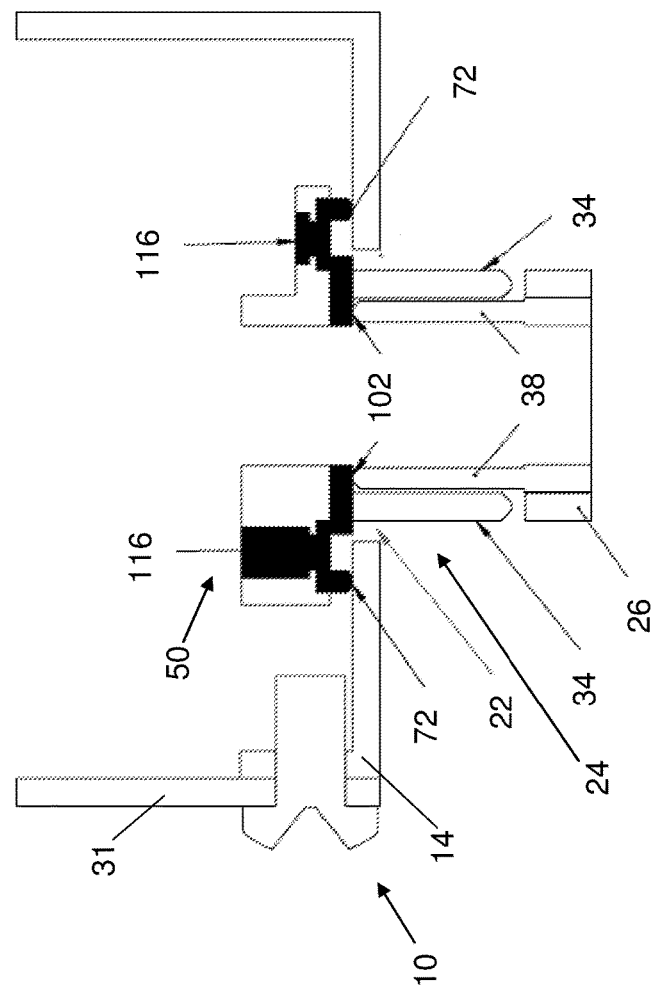
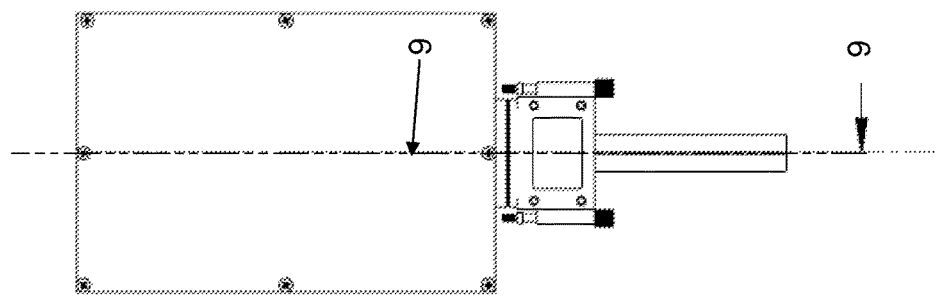

ELECTRICALLY-CONDUCTIVE GASKET

FIELD OF THE INVENTION

The invention is in the field of high-frequency electrical conductors.

DESCRIPTION OF THE RELATED ART

Electrical circuitry packaged in a box or enclosure often needs to be functionally connected to a like enclosure using high-speed cables. The cables usually will need to be able to be removed or replaced and, therefore, will need connectors on each end. The cable connectors are usually the plug while the panel or box connectors are the receptacle in the plug-receptacle pair. The receptacle connector is typically mounted to the electrical panel or face of the electrical box by providing a hole in the panel through which the connector will protrude. Holes will also be provided to accommodate attachment screws. The receptacle connector that is typically mounted to a circuit board, will protrude through the holes in the panel or box face and be attached to that face using special screws.

The holes in the panel or box face are a source for leakage, both for liquids and radio-frequency electromagnetic interference (EMI). Various methods have been used to prevent these leakages. Typically, elastomeric seals have been used either in gasket form or as O-rings to keep liquid (usually water) out. This will typically suffice for the exterior of the connector, but does not account for potential leakage through the connector itself. Liquid, typically water, must be denied access to the contact arrays within the connector. Therefore, a second seal between the cable plug and the receptacle must be provided.

The elastomer seals just described will do a good job of denying water ingress to the electrical circuitry. However these seals will not prevent the passage of high-frequency electro-magnetic field through the gaps caused by the contacts and the spaces formed by clearances internal of the connector pair. Historically this EMI ingress has been blocked by using gaskets formed of "spring fingers" wherever an ingress gap would allow access. These spring fingers would occupy the offending gap and be spaced such that the distance between fingers would not allow high-frequency electro-magnetic fields to penetrate the gap. This spacing will typically need to be on the order of five percent of the electrical wavelength in the media in which it is traveling, typically, air. At very high frequency, this spacing will be very small—on the order of 0.030 inches. Spring fingers with spacing this small will be very fragile and subject to be easily damaged.

Considering the above, there is a need for a more facile solution to the problem of sealing a cable connector to a panel or box, preventing EMI intrusion or water intrusion, or both.

SUMMARY OF THE INVENTION

An injection-molded electrically-conductive elastomer provides both sealing against liquid intrusion, and protection against electromagnetic interference (EMI) intrusion. The electrically-conductive elastomer gasket excels at very high-frequency exclusion because the material is homogeneous compared to the mechanical spacing of historical spring fingers. The use of injection molding produces a unique one-piece gasket that is integral with the receptacle housing, combining the external gasket with the internal gasket. Additionally, the use of a conductive elastomer gasket for EMI exclusion will not be subject to damage as spring fingers are.

According to an aspect, an injection molded conductive elastomer gasket isolates the internal volume of an electrical enclosure, such as an electrical panel or electrical box, from the external of the enclosure for ingress of either liquids or EMI induction.

According to an aspect, a one-piece gasket serves to seal a connector receptacle housing to an electrical enclosure, such as an electrical panel or box, while also sealing a plug connector housing to the electrical enclosure.

According to an aspect, a molded gasket held in place by holes in a receptacle housing through which an elastomer flows during molding, such holes having a larger dimeter on exit so as to form a retention head.

According to an aspect, an internal gasket held in place by the molded pillars through which the elastomer flows during molding.

According to an aspect of the invention, an electrical receptacle includes: a receptacle housing that includes a base and a receptacle receiver protruding from the base, the receptacle receiver configured to receive therein an electrical connector that is mated with the receptacle receiver; and an electrically-conductive gasket molded onto the receptacle housing. The electrically-conductive gasket extends both inside and outside of the receptacle receiver.

According to an embodiment of any paragraph(s) of this summary, the electrically-conductive gasket includes: an inner member that is inside of the receptacle receiver; an outer member that is outside of the receptacle receiver; and pillars that are in holes in the receptacle receiver, wherein the pillars link the inner member and the outer member.

According to an embodiment of any paragraph(s) of this summary, the outer member of the electrically-conductive gasket is molded onto a face of the connector housing.

According to an embodiment of any paragraph(s) of this summary, the outer member is in a recess defined by the receptacle receiver, the face, and a lip of the housing that is along a periphery of the face.

According to an embodiment of any paragraph(s) of this summary, the face has holes therein that pass through the base.

According to an embodiment of any paragraph(s) of this summary, the electrically-conductive gasket fills the holes through the base, and include retention heads at the holes, on a back side of the base.

According to an embodiment of any paragraph(s) of this summary, the holes have a smaller diameter than diameters of the retention heads.

According to an embodiment of any paragraph(s) of this summary, the electrically-conductive gasket is a single-piece continuous unitary gasket.

According to an embodiment of any paragraph(s) of this summary, the electrically-conductive gasket is made of an electrically-conductive elastomer.

According to an embodiment of any paragraph(s) of this summary, the base has a pair of threaded holes on opposite sides of the receptacle receiver.

According to an embodiment of any paragraph(s) of this summary, the electrically-conductive gasket has clearance holes surrounding the threaded holes.

According to an embodiment of any paragraph(s) of this summary, the electrically-conductive gasket has a peripheral lip extending away from the face around a perimeter of the electrically-conductive gasket.

According to an embodiment of any paragraph(s) of this summary, the electrically-conductive gasket also has an inner lip extending around an outside of the receptacle receiver.

According to an embodiment of any paragraph(s) of this summary, the receptacle is in combination with an electrical connector that is coupled to the receptacle.

According to an embodiment of any paragraph(s) of this summary, the receptacle is in combination with an electrical enclosure, wherein the receptacle is mechanically coupled to a wall of the electrical enclosure.

According to another aspect of the invention, a method of forming a gasket on a housing of a receptacle for receiving an electrical connector includes the steps of: molding the seal onto the housing, wherein the molding includes: forming an outer portion of the gasket in a recess of the housing; and flowing material of the gasket from the recess through holes in a receiver of the housing, to form an inner portion of the gasket.

According to an embodiment of any paragraph(s) of this summary, the gasket is made of an electrically-conductive elastomer.

According to an embodiment of any paragraph(s) of this summary, the flowing includes forming pillars of material in the holes, linking the inner portion and the outer portion.

According to an embodiment of any paragraph(s) of this summary, the molding includes flowing material of the gasket through through-holes in a base of the housing, to form retention heads for retaining the gasket on the housing.

According to an embodiment of any paragraph(s) of this summary, the molding includes injection molding.

According to still another aspect of the invention, a method of sealing a connection between an electrical connector and a receptacle that receives the electrical connector includes: mechanically securing the electrical connector to the receptacle; wherein the mechanically securing includes: pressing a first portion of an electrically-conductive gasket of the receptacle against an electrical panel or box; and pressing a second portion of the electrically-conductive gasket against the electrical connector.

According to an embodiment of any paragraph(s) of this summary, the method further includes molding the electrically-conductive gasket onto a housing of the receptacle.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, show various aspects of the invention.

FIG. 8 is a plan view of electrical enclosure and electrical coupling.

FIG. 9 is a sectional view of portions of the enclosure and coupling of FIG. 8, along section 9-9 of FIG. 8.

DETAILED DESCRIPTION

An electrically-conductive gasket is used to provide sealing at openings of an electrical enclosure for making electrical connections, such as for connecting a cable or cables to the enclosure. The gasket provides sealing against both liquids and electromagnetic interference (EMI), and provides sealing between parts that make electrical coupling at the enclosure, and between those parts and the enclosure. The electrically-conductive gasket may be molded on an electrical receptacle that is mechanically coupled to the enclosure, and provides sealing between the electrical receptacle and the enclosure, and between the electrical receptacle and an electrical plug connector that connects to the electrical receptacle. The molding may be accomplished by flowing an electrically-conductive elastomer through holes in the receptacle, to produce portions of the electrically-conductive gasket that are inside and outside of a receiver of the receptacle that receives a nose of the electrical plug connector. Other holes in a base housing of the receptacle may be used to produce retention heads of the electrically-conductive gasket that assist in maintaining the electrically-conductive gasket mechanically coupled to the receptacle. The use of a single-piece electrically-conductive gasket avoids the use of multiple gaskets for sealing against liquids, and avoids the separate and fragile conductive structures for guarding against EMI.

Figure 1:
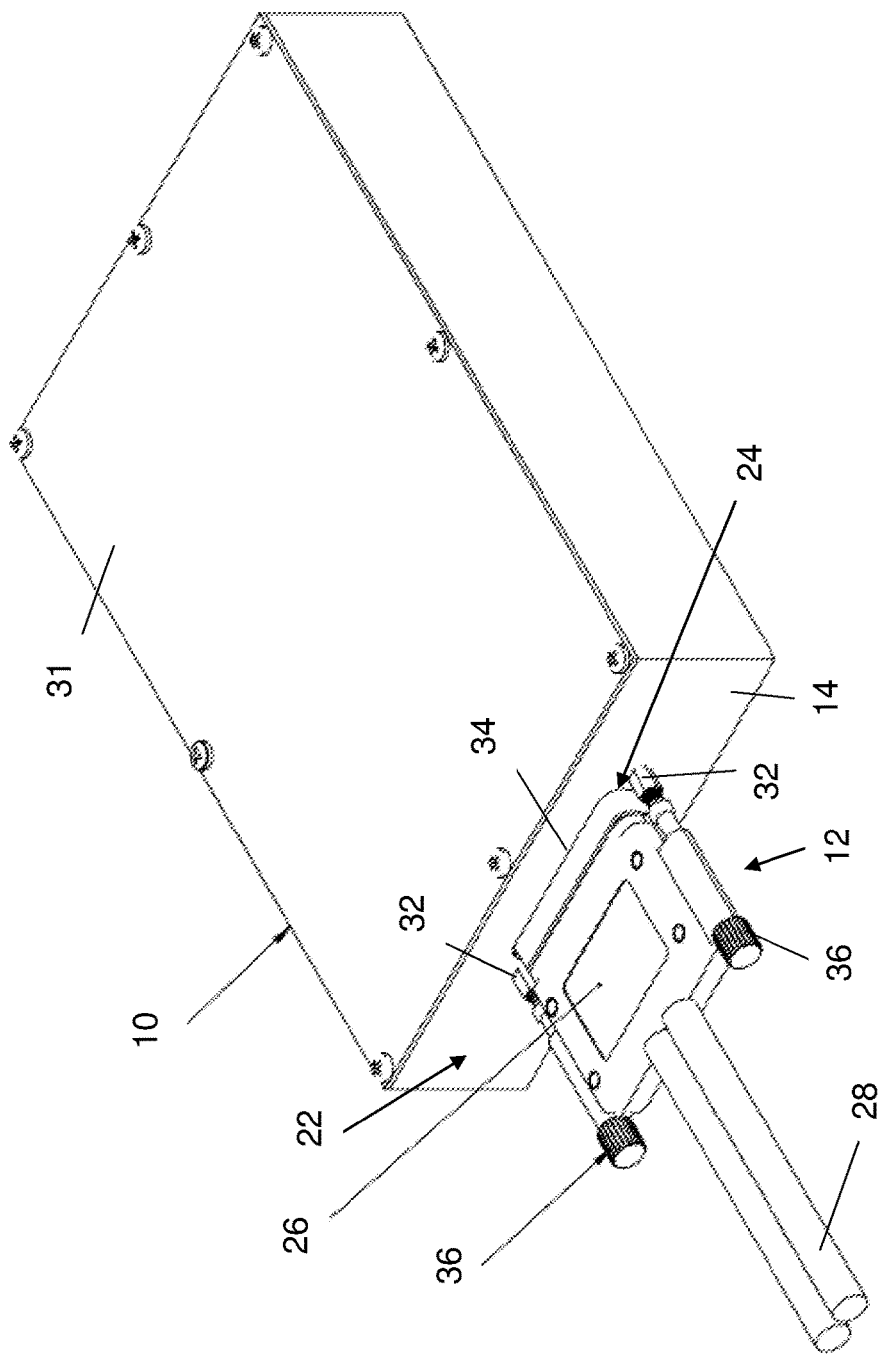
FIG. 1 is an oblique view of an electrical enclosure, with an electrical coupling, according to an embodiment of the invention.
Figure 2:
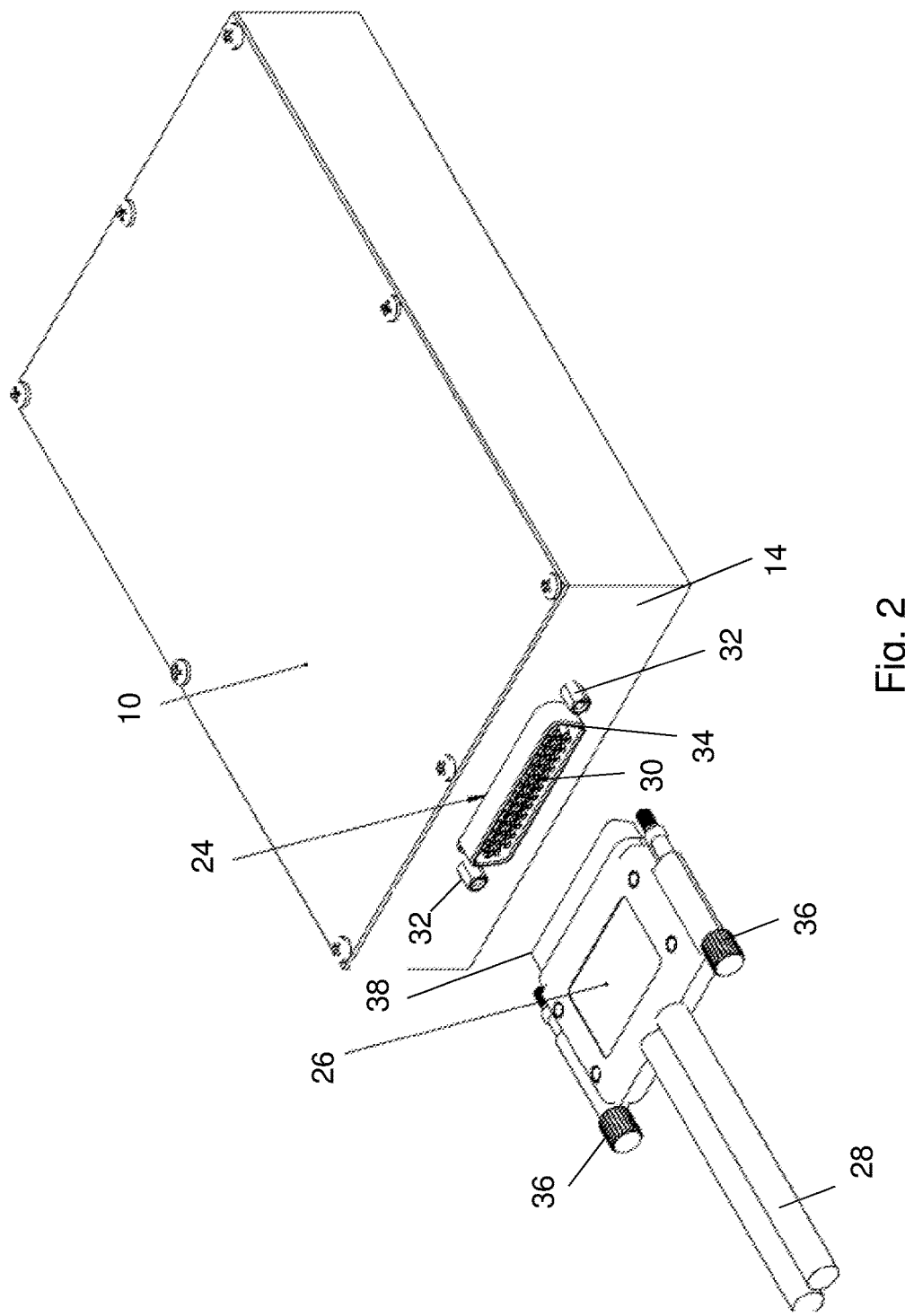
FIG. 2 is an oblique view of the enclosure and coupling of FIG. 1, with the electrical connection and receptacle decoupled.
Figure 3:
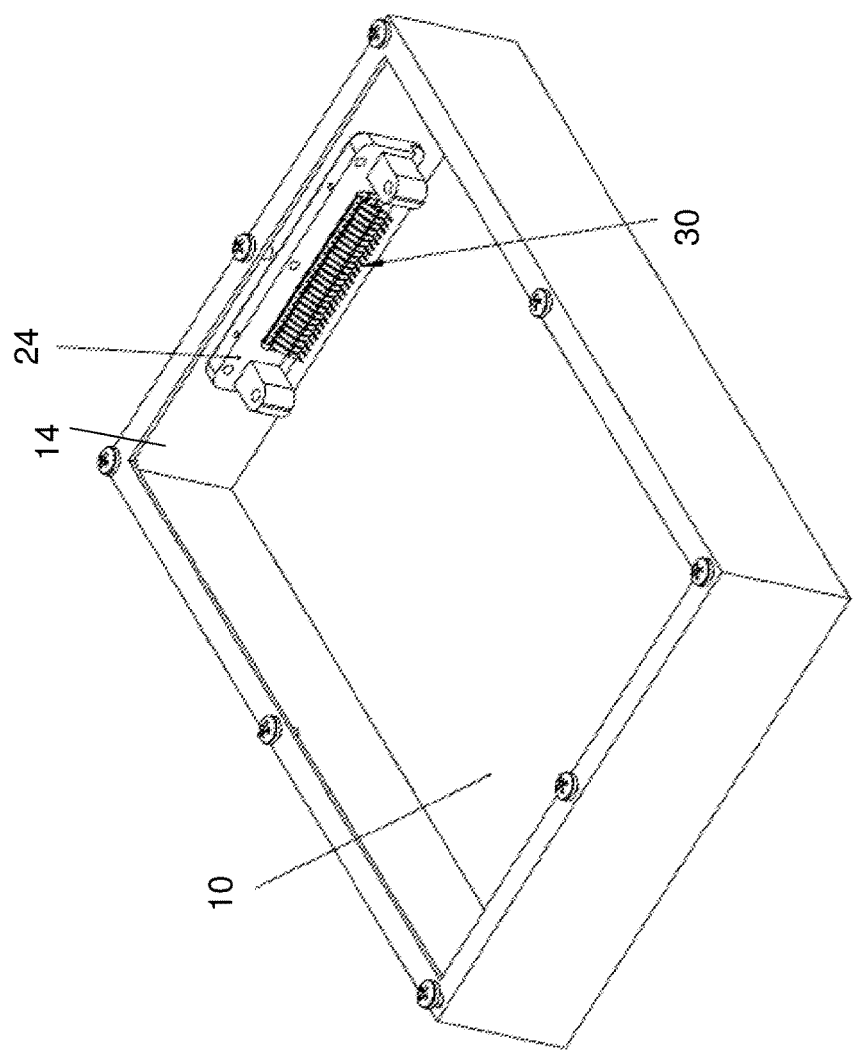
FIG. 3 is an oblique view of the enclosure and receptacle of FIG. 1 with a lid of the enclosure removed to show a back side of the receptacle.
Figure 4:
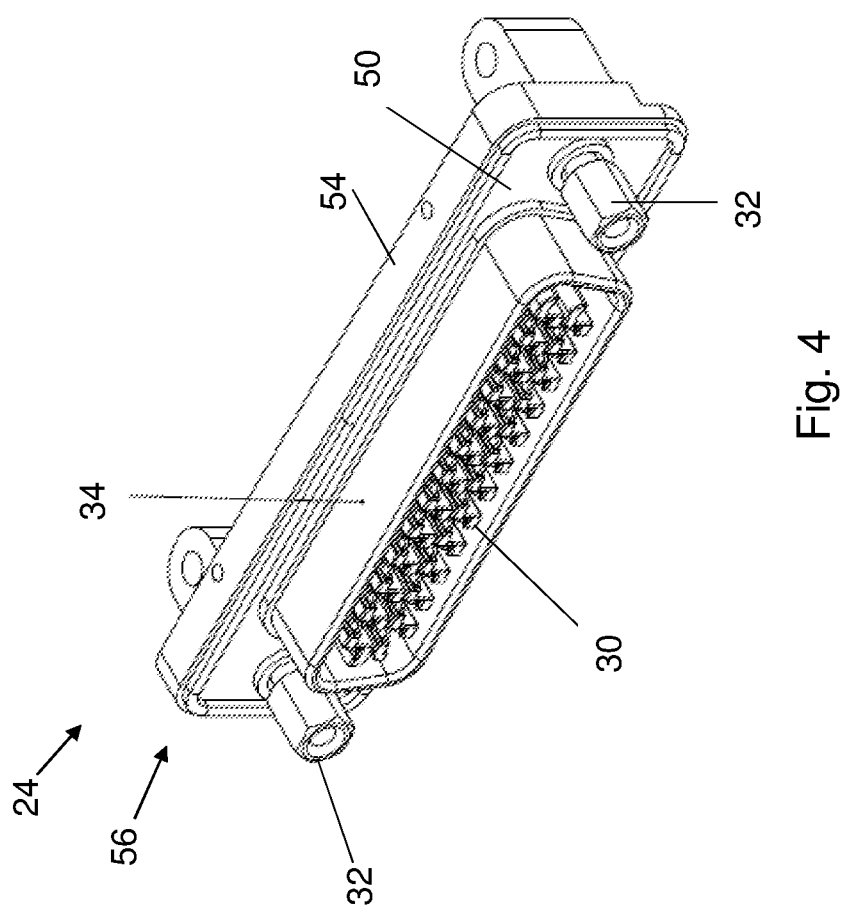
FIG. 4 is an oblique view of the electrical receptacle, showing a front side of the receptacle.
Figure 5:
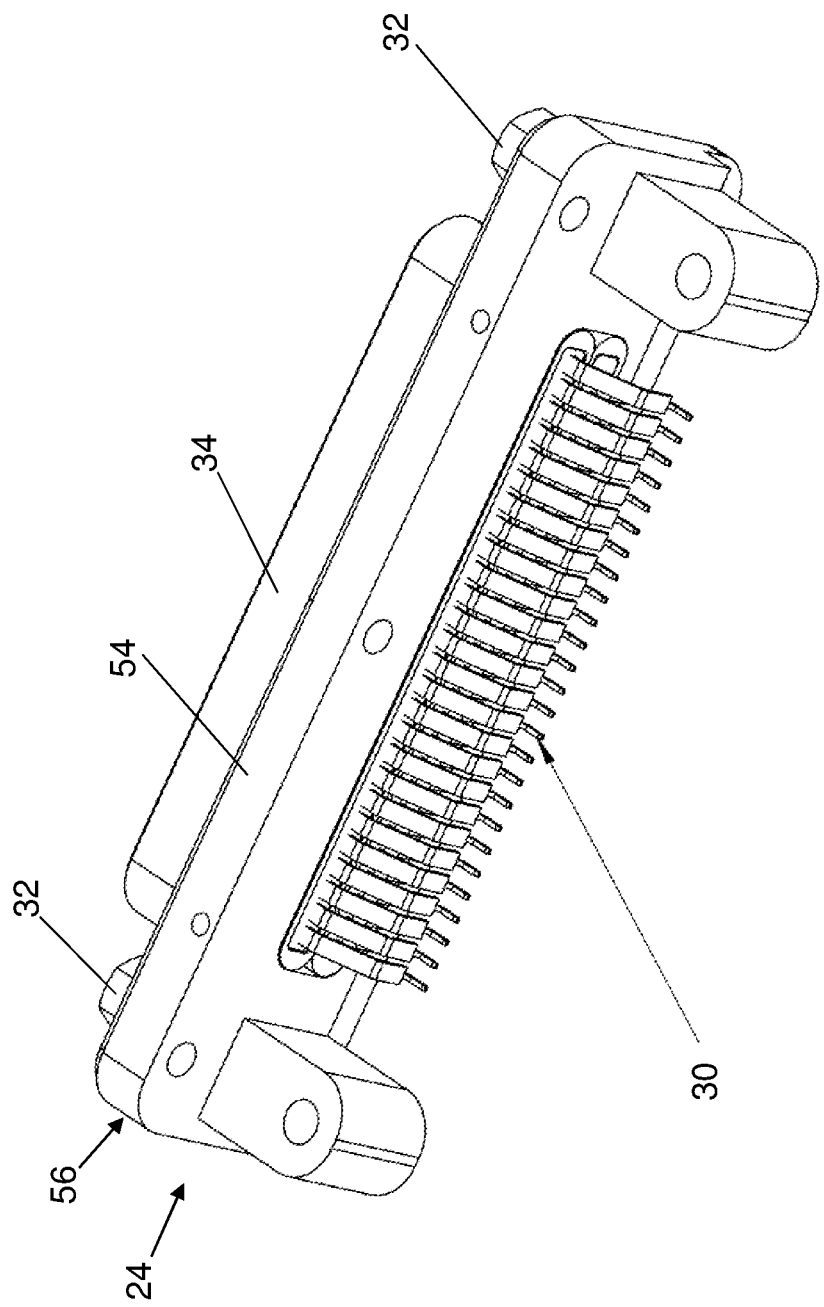
FIG. 5 is another oblique view of the electrical receptacle, showing a back side of the receptacle.
Figure 6:
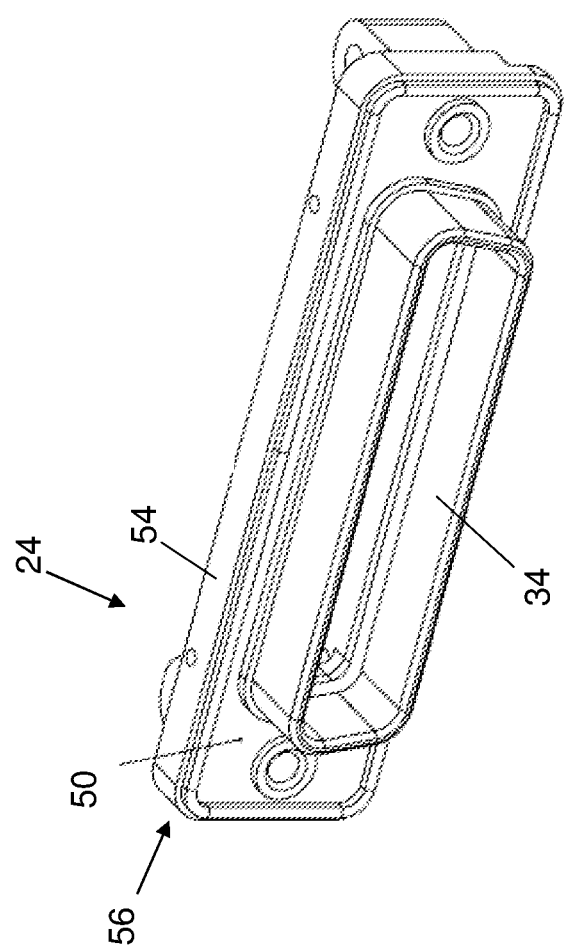
FIG. 6 is an oblique view of a housing of the electrical receptacle, with an electrically-conductive gasket molded onto the housing.
Figure 7:
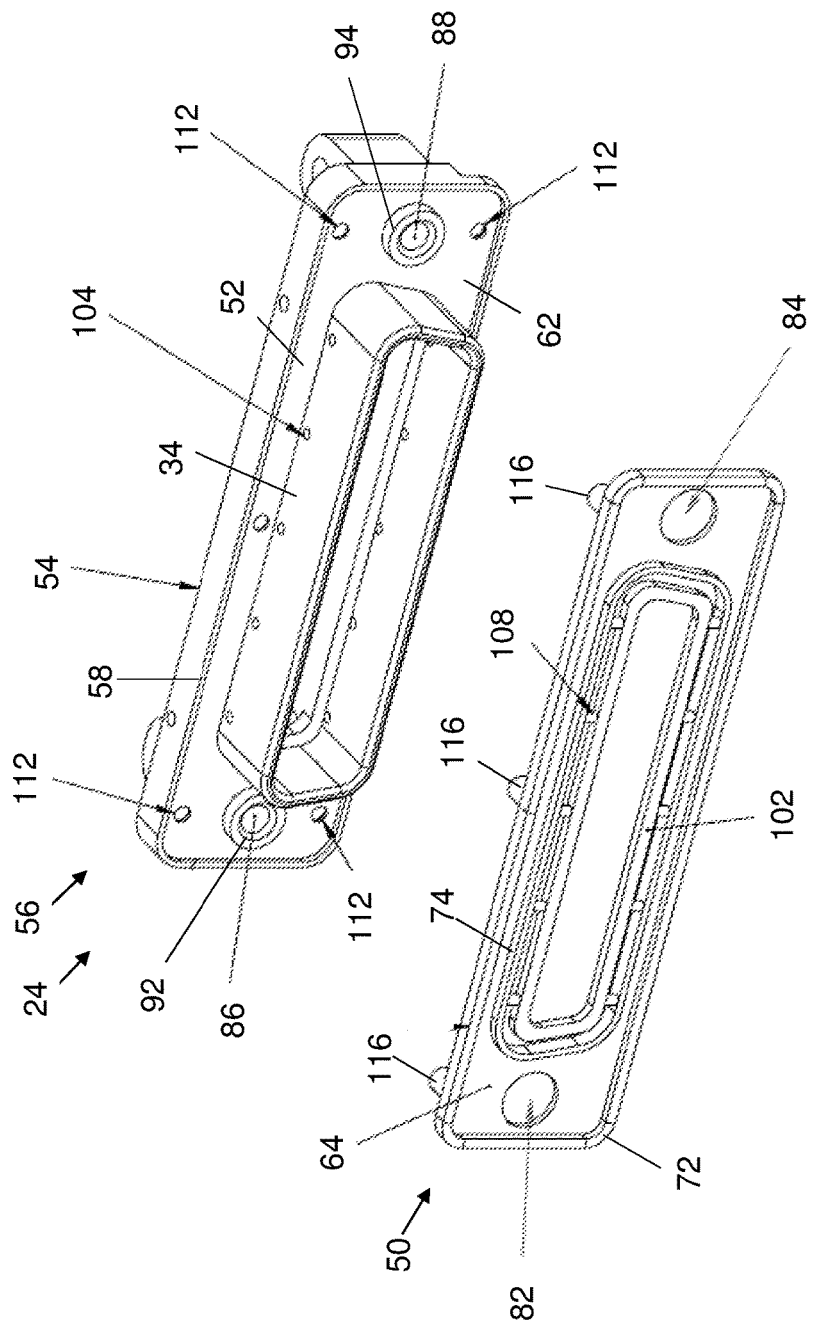
FIG. 7 is an exploded view of the housing and gasket of FIG. 6.

FIGS. 1 and 2 show an electrical enclosure 10, such as an electrical box or electrical panel. An electrical connection to an external device or devices (not shown) is made through an electrical coupling 12 at a wall 14 of the enclosure 10. The wall 14 has one or more holes in it for the coupling, for example having holes 22 that allow access through the wall 14 to parts of an electrical receptacle 24 that engages an electrical plug connector 26 that is used for electrically coupling wires of one or more cables 28 to contacts 30 of the receptacle 24. The contacts are also shown in FIG. 3, with a lid 31 of the enclosure 10 removed for illustration purposes. The lid 31 is secured to the rest of the enclosure 10 by threaded fasteners, and a gasket or other seal (not shown) may be used to seal this connection. Within the enclosure 10 tails of the contacts 30 will be electrically coupled to other components (not shown), such as by being soldered to circuit boards.

The electrical receptacle 24 is secured to the wall 14 by a pair of nuts 32, located on opposite sides of a receiver 34 of the receptacle 24. The nuts 32 are internally threaded, for receiving threaded shafts of thumbscrews 36 of the electrical plug connector 26. The receiver 34 is configured for receiving a nose 38 of the electrical plug connector 26, to make electrical contact between contacts of the electrical plug connector 26, and the contacts 30 of the receptacle 24.

It is desirable in many cases to provide the openings 22 of the electrical enclosure 10 with sealing to prevent ingress of liquids, such as water, which can cause short circuits and other problems for electrical systems. It is also desirable to seal the electrical enclosure 10 to prevent or reduce the effects of electromagnetic interference (EMI), such as EMI induction.

With reference now to FIGS. 4-7, further details are shown of the receptacle 24, and in particular of an electrically-conductive gasket 50 that is molded onto the receptacle 24. The electrically-conductive gasket 50 provides both sealing against ingress of liquids through the holes 22 (FIG. 1) in the enclosure 10 (FIG. 1).

The gasket 50 is molded onto a front face 52 of a base 54 of a housing 56 of the receptacle 24. The front face 52 has a raised lip 58 at its periphery. Together, the front face 52, the lip 58, and the receptacle receiver 34 define a recess 62 where an outer member or portion 64 of the electrically-conductive gasket 50 is formed. The outer member 64 is used to provide sealing between the receptacle 24 and the enclosure wall 14 (FIG. 1). The outer member 64 has a peripheral raised lip 72 abutting the housing lip 58, and an inner lip 74 abutting the receiver 34. The outer member 64 has a pair of holes 82 and 84 corresponding in location to the threaded holes 86 and 88 in the base 54. The threaded holes 86 and 88 receive the nuts 32 (FIG. 1), and are surrounded by raised flanges 92 and 94 on the front face 54.

The gasket 50 also has an inner member or portion 102 that is within the receiver 34, running along an inner surface or the receiver 34. The inner member 102 is used for sealing between the receptacle 24 and the plug connector nose 38 (FIG. 1). Access holes 104 in the receiver 34 are used in molding the inner member 102. The access holes 104 are along a proximal end of the receiver 34, near the receptacle base 34. Gasket material flows through the access holes 104 from the recess 62 outside of the receiver 34, to produce the inner member 102, with pillars 108 of gasket material connecting the inner member 102 with the outer member 64.

The front face 52 has a series of holes 112 that are used to mold structures of the gasket 50 that aid in retaining the gasket adhered to the receptacle housing 56. The holes 112 are through-holes that go through the base 54. With reference in addition to FIGS. 8 and 9, gasket material goes into and through the through-holes 112, to form retention heads 116 on a back side 120 of the base 54, the side opposite from the front face 52. The holes 112 have smaller diameter than the diameter of the retention heads 116. The retention heads 116 thus aid in keeping the gasket 50 mechanically coupled to the housing 56.

The gasket 50 is formed as single piece by a suitable molding process, for example injection molding. The gasket 50 may be formed of a suitable electrically-conductive material, for example an electrically-conductive elastomer, such as a silicone elastomer filled with an electrically-conductive material, such as copper, aluminum, silver, nickel, or graphite, to give a few examples.

FIG. 9 shows the sealing involving various parts of the gasket 50. The nose 38 of the electrical plug connector 26 makes contact with the inner member 102, sealing the connection of the electrical contacts (not shown in FIG. 9) within the nose 38 and the receiver 34. At the top and bottom of the receptacle 24 the peripheral raised lip 72 makes contact with the electrical enclosure wall 14, sealing the opening in the wall 14 through which the receiver 34 protrudes. The tightening of the nuts 32 (FIG. 1) into the threaded holes 86 and 88 (FIG. 7) compresses the lip 72 between the base 54 and the wall 14. Tightening of the thumbscrews 36 (FIG. 1) into the nuts 32 compresses the inner member 102 between the nose 38 and base 54.

The sealing with the electrically-conductive gasket 50 also provides sealing against EMI. The gasket 50 advantageously provides both kind of sealing in a single object, at multiple locations, without the need for multiple gaskets for different holes, and without employing conductive fingers that can be prone to damage.

The illustrated embodiment is only one of a variety of possible ways that an electrically-conductive gasket can be configured to provide sealing against liquid egress and against EMI. Such a molded gasket may be used in a variety of different types of connections where sealing against liquids and EMI is desired. For example such an electrically-conductive gasket may be used in connections other than D-shape connection shown in the illustrated embodiment.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An electrical receptacle comprising:
    a receptacle housing that includes a base and a receptacle receiver protruding from the base, the receptacle receiver configured to receive therein an electrical connector that is mated with the receptacle receiver; and
    an electrically-conductive gasket molded onto the receptacle housing;
    wherein the electrically-conductive gasket extends both inside and outside of the receptacle receiver.

2. The electrical receptacle of claim 1, wherein the electrically-conductive gasket includes:
    an inner member that is inside of the receptacle receiver;
    an outer member that is outside of the receptacle receiver; and
    pillars that are in holes in the receptacle receiver, wherein the pillars link the inner member and the outer member.

3. The electrical receptacle of claim 2, wherein the outer member of the electrically-conductive gasket is molded onto a front face of the housing.

4. The electrical receptacle of claim 3, wherein the outer member is in a recess defined by the receptacle receiver, the front face, and a lip of the housing that is along a periphery of the face.

5. The electrical receptacle of claim 3,
    wherein the front face has holes therein that pass through the base; and wherein the electrically-conductive gasket fills the holes through the base, and include retention heads at the holes, on a back side of the base.

6. The electrical receptacle of claim 5, wherein the holes have a smaller diameter than diameters of the retention heads.

7. The electrical receptacle of claim 1, wherein the electrically-conductive gasket is a single-piece continuous unitary gasket.

8. The electrical receptacle of claim 1, wherein the electrically-conductive gasket is made of an electrically-conductive elastomer.

9. The electrical receptacle of claim 1,
wherein the base has a pair of threaded holes on opposite sides of the receptacle receiver; and
wherein the electrically-conductive gasket has holes around the threaded holes.

10. The electrical receptacle of claim 1, wherein the electrically-conductive gasket has a peripheral lip extending away from the face around a perimeter of the electrically-conductive gasket.

11. The electrical receptacle of claim 10, wherein the electrically-conductive gasket also has an inner lip extending around an outside of the receptacle receiver.

12. The electrical receptacle of claim 1, in combination with an electrical connector that is coupled to the receptacle.

13. The electrical receptacle of claim 1, in combination with an electrical enclosure, wherein the receptacle is mechanically coupled to a wall of the electrical enclosure.

* * * * *